United States Patent [19]
Hanari et al.

[11] Patent Number: 5,532,906
[45] Date of Patent: Jul. 2, 1996

[54] WIRING SUBSTRATE

[75] Inventors: Jun Hanari, Kawasaki; Takeshi Miyagi, Fujisawa; Kazuhiro Matsumoto, Yokohama; Ayako Tohdake, Tokyo; Yoshitaka Fukuoka, Kawasaki, all of Japan

[73] Assignee: Kabushiki Kaisha Toshiba, Kawasaki, Japan

[21] Appl. No.: 505,707

[22] Filed: Jul. 21, 1995

Related U.S. Application Data

[63] Continuation of Ser. No. 119,576, Sep. 13, 1993, abandoned.

[30] Foreign Application Priority Data

Sep. 14, 1992 [JP] Japan ................. 4-244872

[51] Int. Cl.[6] ................. H05K 1/00; H01R 23/68; H01L 23/48
[52] U.S. Cl. ............... 361/749; 361/709; 361/760; 361/776; 361/789; 361/794; 361/813; 257/700; 257/690
[58] Field of Search ................. 361/704, 707, 361/709–712, 714–723, 742, 749, 758, 760–761, 776, 789, 794, 804, 813; 257/700, 703–707, 678, 696, 712–713, 690–693, 796; 174/52.2, 52.3, 52.4

[56] References Cited

U.S. PATENT DOCUMENTS

| 4,855,869 | 8/1989 | Tsuti ................... 361/707 |
|---|---|---|
| 5,031,025 | 7/1991 | Brun et al. . |
| 5,055,914 | 10/1991 | Shimizu et al. ............. 361/688 |
| 5,081,005 | 1/1992 | Lin et al. .................. 361/749 |
| 5,153,709 | 10/1992 | Fukuoka . |
| 5,196,725 | 3/1993 | Mita et al. ................. 257/672 |
| 5,315,486 | 5/1994 | Fillion et al. ............... 361/792 |

FOREIGN PATENT DOCUMENTS

| 0266210 | 5/1988 | European Pat. Off. ............. 257/700 |
|---|---|---|
| 57-188897 | 11/1982 | Japan . |
| 61-1007657 | 1/1986 | Japan ........................ 257/700 |
| 62-122257 | 6/1987 | Japan . |

OTHER PUBLICATIONS

"RELIABILITY EVALUATION OF SILICON ON SILICON MULTICHIP MODULES", Kenji Okajima, IMC 1992 Proceedings, Yokohama, pp. 533, Jun. 5, 1992.

*Primary Examiner*—Bot L. Ledynh
*Attorney, Agent, or Firm*—Finnegan, Henderson, Farabow, Garrett & Dunner

[57] ABSTRACT

A wiring substrate includes a ceramic substrate having a first conductive connection pattern on an lower surface of the ceramic substrate and a second conductive connection pattern on an upper surface or the lower surface of the ceramic substrate, a multilayered wiring portion arranged on the lower surface of the ceramic substrate through the first conductive connection pattern and including an insulating layer made of an organic polymer, on which an integrated circuit and/or a circuit part are/is mounted, and a flexible wiring substrate, connected to the second conductive connection pattern, for connecting the integrated circuit and/or the circuit part to an external circuit.

6 Claims, 6 Drawing Sheets

WIRING SUBSTRATE

This application is a continuation of application Ser. No. 08/119,576 filed Sep. 13, 1993, now abandoned.

BACKGROUND OF THE INVENTION

1. Field of the Invention

The present invention relates to a wiring substrate and, more particularly, to connection between an external substrate and a multilayered wiring substrate on which one or a plurality of integrated circuits and circuit parts are mounted.

2. Description of the Related Art

Conventionally, an integrated circuit is stored in a container called a package singly or together with several parts to facilitate handling of the integrated circuit and not to degrade the characteristics of the integrated circuit. The package is connected to an external substrate by a pin grid array, a flat lead, a flexible wiring substrate, or the like. For example, packages using the pin grid array or the flat lead are already on the market.

A packaging system for storing a substrate on which a plurality of integrated circuits or circuit parts are mounted in one container is called a multi-chip module (MCM). This MCM is used to increase a packing density of the parts and to realize a compact apparatus having high performance. An important problem of the MCM is that a large number of parts are efficiently arranged in a limited area.

Conventionally, an MCM is connected to an external substrate by a pin grid array, a flat lead, or a flexible wiring substrate as in a package.

For example, in Jpn. Pat. Appln. KOKAI Publication No. 1-272140, an MCM in which an Si wiring substrate is fixed on an A1N package is disclosed. In this case, signal inputs/outputs using a lead frame are shown. In Jpn. Pat. Appln. KOKAI Publication No. 2-184052, an MCM in which a sapphire substrate is mounted on a ceramic substrate is described. In this case, a connection method using contact pins is described.

As the arrangement of an MCM, in addition to the above method using a substrate on which a plurality of elements are mounted and a container, the following method is known.

For example, in a silicon-on-silicon MCM (IBM (corp)), a chip is directly mounted on a silicon substrate (IMC, 1992, proceeding, P533). In this case, input/output operations are performed using a flexible wiring substrate.

According to another MCM, a wiring portion having an organic polymer layer as an insulating layer is formed on a ceramic multilayered wiring substrate comprising an aluminum nitride sintered body, and an integrated circuit, a circuit part, and the like are mounted on the wiring portion or the ceramic substrate. In this MCM, a cap is formed on the ceramic substrate and terminals connected to an external circuit are formed. In this case, the ceramic substrate is used as a part of a package. In this MCM, the size of the ceramic multilayered wiring substrate comprising the aluminum nitride sintered body is the maximum size of the MCM.

In any of the methods described above, an important problem of an MCM is that a large number of parts are effectively arranged in a limited area.

When a signal is to be extracted from a surface on which parts are mounted, the area of portions on which pins or leads are mounted restricts an area for mounting parts. When the number of signals is increased, especially in a method using pins, when the size of a package or an interval between pins is not changed, the area of the pin portions is increased, thereby further decreasing the area of portions for mounting parts.

In an MCM in which a multilayered wiring portion having an organic polymer layer as an insulating layer is arranged on a ceramic wiring substrate comprising aluminum nitride or an aluminum nitride sintered body or a wiring substrate comprising another an insulator, the following problems are posed.

That is, pins or leads are generally connected by brazing. This brazing includes the step of heating the connection portions of the pins and leads to about 800° C. Therefore, the brazing step must be performed before the multilayered wiring portion having the organic polymer layer as the insulating layer is formed. For this reason, processing such as etching in the manufacturing process of the multilayered wiring film having the organic polymer layer as the insulating layer may damage the leads or pins, and a special jig for protecting the leads or pins from an etching solution is required. In addition, since the pins and leads project from the substrate surface, in a process of forming the multilayered wiring film having the organic polymer layer as the insulating layer or in the step of mounting an integrated circuit, a conventional jig for mounting a substrate cannot be advantageously used. This drawback may increase production cost.

There is a method of connecting leads at a low temperature without adversely affecting other portions. In this case, however, when an MCM is to be externally mounted, special processing in which the MCM is mounted at a temperature lower than that at which the leads are connected must be performed. In this case, production cost is increased.

In addition, when a flexible wiring substrate is mounted on the lower surface of a silicon substrate in a silicon-on-silicon MCM, special processing for connecting the upper surface of the silicon substrate to the lower surface of the silicon substrate must be performed. For example, a method of forming small through holes in the silicon substrate and forming conductive pillars in the holes is known. In this method, a electrodes are necessarily arranged at positions of the upper surface of the silicon substrate corresponding to the flexible wiring substrate connection portion on the lower surface of the silicon substrate, which restricts the area of the chip mounting surface. In addition, production cost is increased.

In addition, when input/output operations are performed through pins and leads, a characteristic impedance cannot be easily controlled. This method cannot be easily applied to a high-speed signal.

SUMMARY OF THE INVENTION

It is an object of the present invention to provide a wiring substrate which does not require a heating step at a high temperature and can be easily handled.

According to the present invention, there is provided a wiring substrate comprising a ceramic substrate having a first conductive connection pattern on a lower surface of the ceramic substrate and a second conductive connection pattern on an upper surface or the lower surface of the ceramic substrate, a multilayered wiring portion arranged on the lower surface of the ceramic substrate through the first conductive connection pattern and including an insulating layer made of an organic polymer, on which an integrated circuit and/or a circuit part are/is mounted, and a flexible wiring substrate, connected to the second conductive connection pattern, for connecting the integrated circuit and/or the circuit part to an external circuit.

According to the present invention, there is provided a wiring substrate comprising a ceramic substrate having a first conductive connection pattern on a lower surface of the ceramic substrate, a second conductive connection pattern on an upper surface of the ceramic substrate, and a conductive layer connected to the first conductive connection pattern and the second conductive connection pattern in the ceramic substrate, a multilayered wiring portion arranged on the lower surface of the ceramic substrate through the first conductive connection pattern and including an insulating layer made of an organic polymer, as an insulating layer, on which an integrated circuit and/or a circuit part are/is mounted, and a flexible wiring substrate connected to the second conductive connection pattern and obtained by forming a power supply layer, a ground layer, and a signal wiring layer on a resin substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Figure 1:
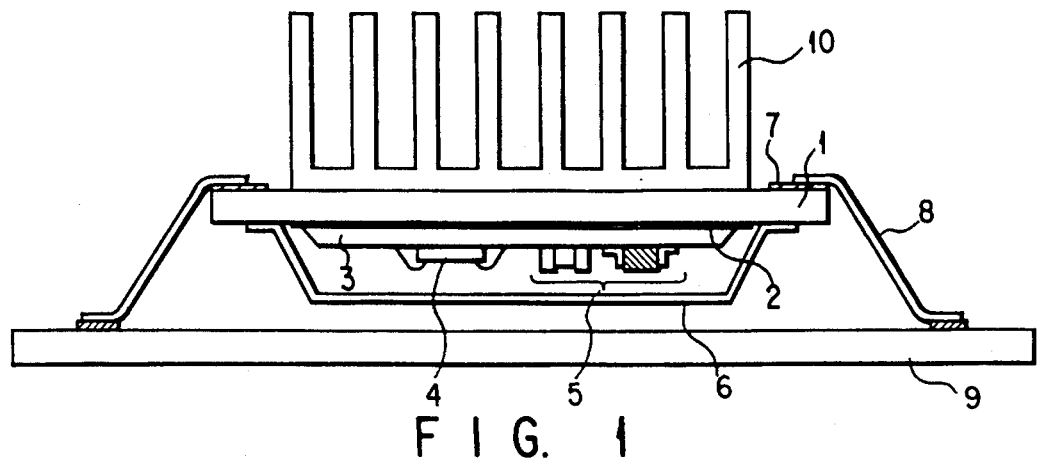
FIG. 1 is a sectional view showing a wiring substrate according to the first embodiment of the present invention.

FIG. 1 is a sectional view showing the first embodiment of the present invention. In FIG. 1, a multilayered wiring portion 3 having an organic polymer layer as an insulating layer is formed, through a multilayered wiring portion connection pattern 2, on the lower surface of a ceramic multilayered wiring substrate 1 comprising an aluminum nitride sintered body. An integrated circuit 4 and other circuit parts 5 are arranged on the multilayered wiring portion 3. The multilayered wiring portion 3 is covered with a cap 6. A flexible wiring substrate mounting pattern 7 is formed on an end portion of the upper surface of the ceramic multilayered wiring substrate 1, and one end of a flexible wiring substrate 8 is connected to the ceramic multilayered wiring substrate 1 through the flexible wiring substrate mounting pattern 7. The other end is connected to an external substrate 9. Note that a heat sink 10 is mounted on the upper surface of the ceramic multilayered wiring substrate 1.

The material of the ceramic multilayered wiring substrate 1 is not limited to the aluminum nitride sintered body, and $Al_2O_3$ and $SiC$ may be used as the material of the ceramic multilayered wiring substrate 1. As an organic polymer constituting the insulating layer of the multilayered wiring portion 3, polyimide or the like can be used.

As a resin constituting a resin substrate of the flexible wiring substrate, polyimide of the like can be used.

The ceramic multilayered wiring substrate 1 is electrically connected to the multilayered wiring portion 3 by the multilayered wiring portion connection pattern 2 formed on the lower surface of the ceramic multilayered wiring substrate 1. In addition, the multilayered wiring portion connection pattern 2 is connected to the flexible wiring substrate mounting pattern 7 formed on the end portion of the upper surface of the ceramic multilayered wiring substrate 1 through a conductor formed inside the ceramic multilayered wiring substrate 1 or by metallizing the side surface of the ceramic multilayered wiring substrate 1. In this manner, a signal or power supply voltage is exchanged between the integrated circuit 4, the circuit parts 5, and the external substrate 9. The flexible wiring substrate mounting pattern 7 and the flexible wiring substrate 8 are electrically connected to each other by soldering or the like. The flexible wiring substrate 8 is connected to the external substrate 9 by soldering or through a connector. In this manner, the internal circuit is connected to the external circuit.

In the wiring substrate shown in FIG. 1, the wiring portion 3, having the organic polymer as an insulating layer, on which the integrated circuit 4 and the other circuit parts 5 are mounted, is arranged on the lower surface of the ceramic substrate 1, and the flexible wiring substrate 8 for connecting these circuits to an external circuit is mounted on the upper surface of the ceramic multilayered wiring substrate 1. That is, the flexible wiring substrate mounting connection pattern 7 is formed on the upper surface of the ceramic multilayered wiring substrate 1 on which the integrated circuit and the other circuit parts are not mounted. For this reason, the connection pattern 7 does not adversely affect the step of mounting the integrated circuit 4 or the like, and does not restrict the area of the portion for mounting the circuit parts. As a result, an MCM which can be easily handled can be realized.

The flexible wiring substrate 8 can be connected to the ceramic multilayered substrate 1 in the following manner.

For example, assume that an Sn—Pb alloy generally used as a solder is used. In this case, the solder is melted at a temperature of about 190° C. For this reason, the ceramic multilayered wiring substrate 1 is heated to a temperature of about 150° C. to 200° C. in advance. This substrate temperature varies depending on an atmosphere in which a substrate heating apparatus or the substrate is arranged. In addition, preliminary soldering or solder plating may be subjected to the flexible wiring substrate mounting pattern 7 in advance. Similarly, preliminary soldering or solder plating may be subjected to the wiring pattern of the flexible wiring substrate 8.

Connection between the wiring pattern of the flexible wiring substrate 8 and the flexible wiring substrate mounting pattern is as follows. That is, the patterns to be connected overlap each other, each pair of patterns may be soldered using a soldering iron or the like. In addition, after patterns to be connected overlap each other, the overlapping portion is compressed and heated using a heating jig having a width equal to or larger than that of the flexible wiring substrate 8 and equal to the longitudinal length of the mounting pattern to melt the solder, so as to connect the patterns to each other. Thereafter, the solder is rapidly cooled, thereby completing a soldering operation. Although ultrasonic waves may be used to heat the heating jig, the heating jig may be heated using a heater, as a matter of course. When the soldering iron or the heating jig is used, they may be heated to about 200° to 250° C. At this temperature, the polyimide used as an insulating layer is not adversely affected. In addition, after IC chips or other electric circuit parts are mounted, the above soldering operation can be performed without any problem. Since a temperature at which a solder is used depends on the composition of the solder, a proper solder which can be connected at a desired temperature may be selected in consideration of an adhesive for mounting chips, a member for mounting a cap, and an order of the connecting steps. Therefore, the above heating temperature of the substrate and the temperature of the heating jig are properly changed. In general, the temperature of a connection member in a preceding step is often higher than that in the subsequent steps.

An anisotropic conductive film is used in the following manner. That is, the anisotropic conductive film may be coated on the flexible wiring substrate mounting pattern 7 and may overlap the pattern of the flexible wiring substrate, and the flexible wiring substrate mounting pattern 7 and the flexible wiring substrate 8 may be connected to each other using the heating jig. As the anisotropic conductive film, a commercially available anisotropic conductive film can be used. For example, Anisolms AC-7104 and AC-7144 available from Hitachi Chemical Co. Ltd.; CP7131 and CP3131 available from Sony Chemicals Corp.; or the like can be used. As the heating jig, a thermocompression bonding apparatus AC-S300 available from Hitachi Chemical Co. Ltd. can be used. In this case, a mounting temperature is about 130° C. to 180° C., as in use of the solder, and the polyimide or ICs are not adversely affected.

As described above, when the flexible wiring substrate 8 is used as an input/output terminal, the flexible wiring substrate 8 can be mounted by a process having a temperature lower than that of brazing or the like, and a wiring substrate can be realized by a ceramic substrate on which a thin film wiring line having a polyimide layer as an insulating layer is formed.

When the flexible wiring substrate 8 is used as described above, a degree of freedom of connection to the external circuit is increased. That is, selection of a solder and a connector, a combination of them, selection of a connection method can be properly performed. In addition, when a connection position need not be necessarily close to the MCM, the flexible wiring substrate 8 can extend to a proper position for the convenience of other circuits so as to be connected to the ceramic substrate 1. In addition, when the flexible wiring substrate 8 is exchanged, one MCM can be used in several applications.

According to the connection method using the flexible wiring substrate 8 as shown in FIG. 1, a heat sink cannot be mounted on the portion, of the ceramic multilayered wiring substrate 1, on which the flexible wiring substrate 8 is mounted, i.e., on the peripheral portion of the upper surface of the ceramic multilayered wiring substrate 1. However, when a main heat-generating member, in general, an integrated circuit, is arranged at the central portion of the lower surface of the ceramic multilayered wiring substrate 1, this problem can be solved.

According to the connection method using the flexible wiring substrate 8, a characteristic impedance can be controlled. This method can be applied to a high-speed signal.

Figure 2:
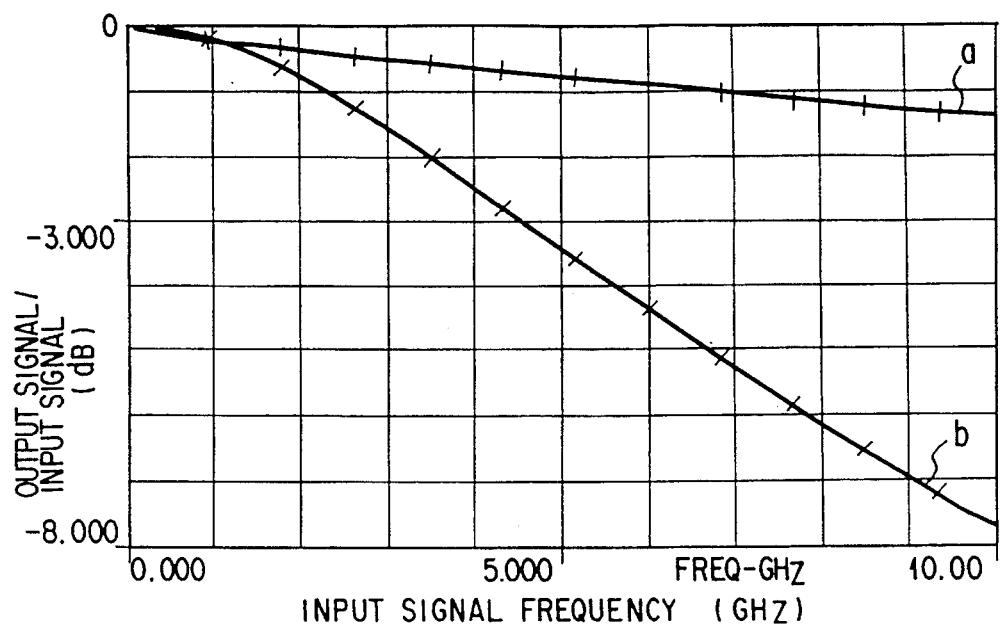
FIG. 2 is a graph showing passing characteristics compared when a flexible wiring substrate and a Kovar pin are used.

For example, when a coplanar line path is formed in a flexible wiring substrate having a pitch of 0.275 mm, a signal line width of 0.125 mm, and a wiring length of 12.7 mm, the calculation result of passing characteristics is shown in FIG. 2. In FIG. 2, a curve a represents the passing characteristics of the flexible wiring substrate, and a curve b represents the passing characteristics of a Kovar pin. Note that the thickness of the conductor of the flexible wiring substrate is 35 μm, and the substrate dielectric constant of the flexible wiring substrate is 3.5. For comparison between their passing characteristics, a calculation result obtained when the Kovar pin (model, 3.5 nH, 50 mΩ) having a length of 2.5 mm and a diameter of 0.46 mm is used is also shown in FIG. 2.

As the results shown in FIG. 2, when a frequency is 1 GHz, the values of the flexible wiring substrate and the Kovar pin are almost equal to each other, i.e., about −0.2 dB. It is understood that the pin and the flexible wiring substrate have the same characteristics in the low-frequency range. However, when the frequency is increased, the passing characteristics of the Kovar pin are abruptly degraded, and a high-frequency wave cannot pass through the pin. In contrast to this, the characteristics of the flexible wiring substrate are rarely degraded, and it is understood that the flexible wiring substrate is advantageously used in a case wherein a high-speed signal is used.

Figure 3:
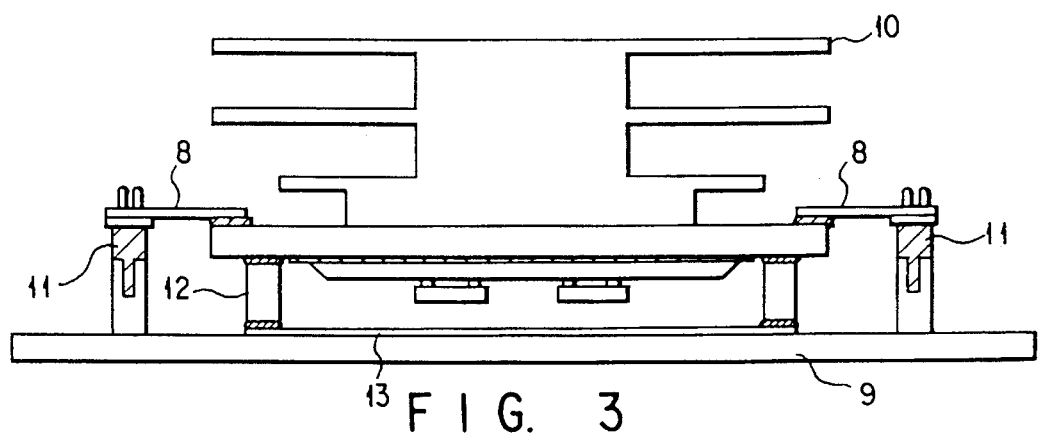
FIG. 3 is a sectional view showing an example wherein a flexible wiring substrate is connected to an external circuit by a connector.

FIG. 3 is an embodiment using a connector 11 for connecting a flexible wiring substrate 8 to an external circuit. According to this embodiment, an MCM can be easily exchanged. In addition, since the height of the lower surface of the MCM can be set to be equal to the height of the connection portion of the connector 11, bending of the flexible wiring substrate can be reduced, disconnection of the flexible wiring substrate caused by bending the flexible wiring structure is advantageously prevented. Note that, in FIG. 3, reference numeral 12 denotes a seal ring, and reference numeral 13 denotes a lid. Although the cap in FIG. 1 and the seal ring in FIG. 3 are fixed on the substrate surfaces, respectively, they may be fixed on the side surfaces of the substrates, respectively. For example, this method can be easily performed by metallizing the side surface of the substrate.

In FIG. 3, although the flexible wiring substrate 8 is connected in an almost planar state, the flexible wiring substrate 8 is preferably connected with a margin for variations in a connection portion, a positional error of the connector 11, and the connection/disconnection of the connector 11. In addition, when the characteristic impedance of the flexible wiring substrate 8 is properly controlled by a multilayered wiring film having an organic polymer layer as an insulating layer or a connector having a characteristic impedance equal to the characteristic impedance of other wiring portions, an ideal wiring substrate can be obtained.

Figure 4:
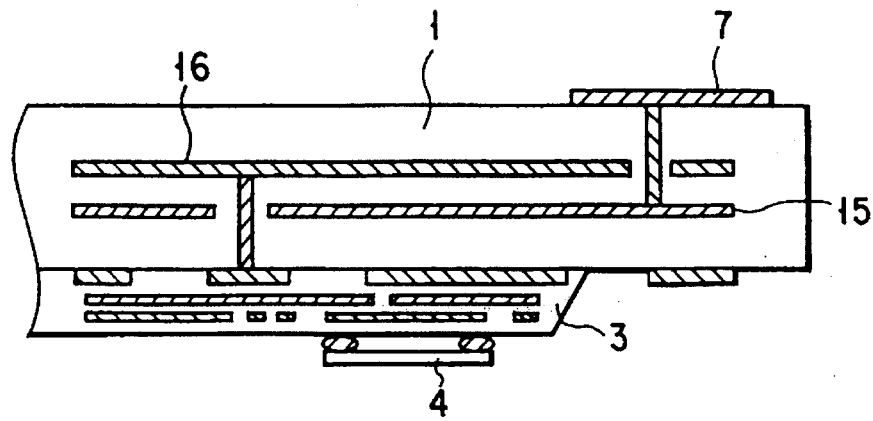
FIG. 4 is a sectional view showing a ceramic substrate in which a power supply layer and a ground layer are incorporated.

FIG. 4 shows an embodiment using a ceramic substrate in which a power supply layer and a ground layer are incorporated. A power supply layer 15 and a ground layer 16 are incorporated in a ceramic substrate 1, and a power supply voltage is applied from a flexible wiring substrate (not shown) to the power supply layer 15 through a flexible wiring substrate mounting pattern 7. The power supply layer 15 is connected to a thin film wiring portion 3 through a via (not shown), and is connected to a semiconductor chip 4. In this manner, the power supply voltage is applied to the semiconductor chip 4. When a cap or seal ring (not shown) is mounted on the arrangement shown in FIG. 4, the arrangement can be used as an MCM. This MCM can increase an earth capacity of a power supply and is advantageous to stabilize the power supply.

Figure 5:
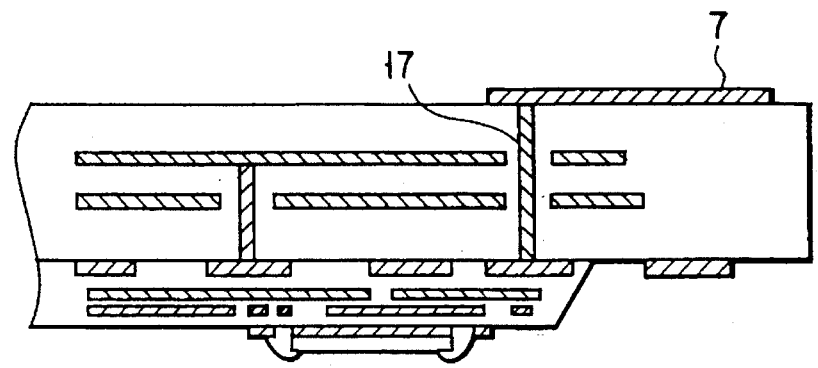
FIG. 5 is a sectional view showing a ceramic substrate through which a via extends.

FIG. 5 shows an embodiment in which a via contact extending through a ceramic substrate is formed. A via contact 17 is formed in the ceramic substrate to extend therethrough, and an impedance-controlled flexible wiring substrate (not shown) is connected to a flexible wiring substrate mounting pattern 7 and connected to an impedance-controlled thin film portion through the via contact 17. According to the wiring substrate shown in FIG. 5, the length of a wiring line whose impedance is not matched can be minimized. Therefore, the wiring substrate can be advantageously applied to a case wherein a high-speed signal is used.

Figure 6:
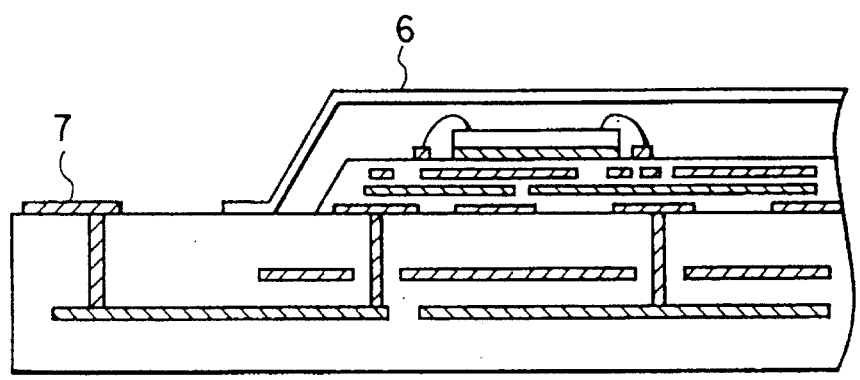
FIG. 6 is a sectional view showing an example wherein a flexible wiring substrate is mounted on the surface of a ceramic multilayered wiring substrate.

In each of the wiring substrates shown in FIGS. 1 and 3 to 5, the flexible wiring substrate mounting pattern is formed on the upper surface of the ceramic multilayered wiring substrate, and the flexible wiring substrate is mounted on the flexible wiring substrate mounting pattern. In contrast to this, FIG. 6 shows an example wherein a flexible wiring substrate mounting pattern 7 is formed on the lower surface of a ceramic multilayered wiring substrate, i.e., on a thin film wiring side, and a flexible wiring substrate is mounted on the flexible wiring substrate mounting pattern 7. In this case, the flexible wiring substrate mounting pattern 7 is formed outside a cap.

Figure 7:
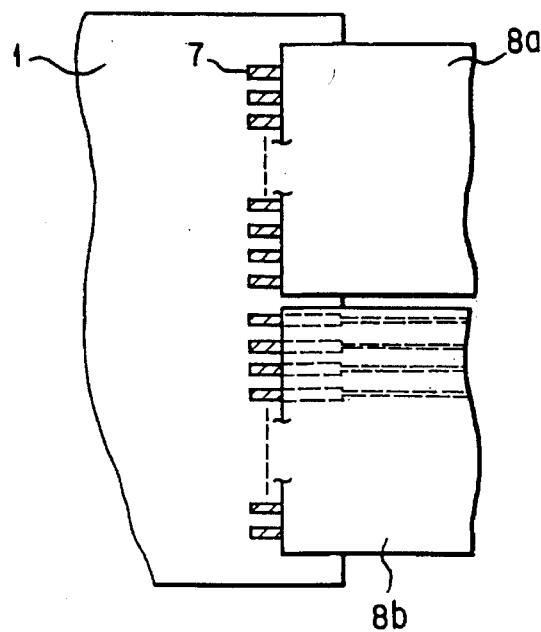
FIG. 7 is a plan view showing an example wherein two flexible wiring substrates are mounted to be close to each other.

FIG. 7 shows an embodiment wherein two flexible wiring substrates 8a and 8b are mounted to be close to each other. This embodiment corresponds to a structure in which a flexible wiring substrate having a plurality of wiring lines is divided and mounted. The advantages of this embodiment is conspicuous in the following case. That is, the manufacturing precision of the flexible wiring substrate and an error of a pattern position are relatively determined with reference to the entire length of the flexible wiring substrate. For example, when a flexible wiring substrate on which 150 patterns each having a width of 0.25 mm and a pitch of 0.5 mm are formed is used, the errors of absolute positions of the patterns at an end portion of the flexible wiring substrate are increased. Assume that the entire width Of the flexible wiring substrate is about 75 mm, and, for example, assume that the error is ±1%. In this case, when one side of the pattern is used as a reference, a positional error at the other side of the pattern becomes about ±0.75 mm. For this reason, a positional error between the patterns and the flexible wiring substrate of the ceramic substrate occurs. In the worst case, a connection cannot be performed, and also an erroneous signal may be connected. For this reason, as in the embodiment shown in FIG. 7, when the two-divided flexible wiring substrates are used, the entire width of one of the flexible wiring substrate is about 38 mm. For example, assume that an error is ±1% as described above. In this case, when the pattern of one of the flexible wiring substrates is used as a reference, the positional error of the pattern of the other of the flexible wiring substrates is about ±0.38 mm. When the central portion of the flexible wiring substrate is used as a reference, the error of each of both the ends of the flexible wiring substrate is ±0.19 mm. Therefore, proper connection can be performed. In this manner, the plurality of flexible wiring substrates 8a and 8b are used to be close to each other, an increase in relative error can be prevented, and the connection can be reliably performed.

Figure 8:
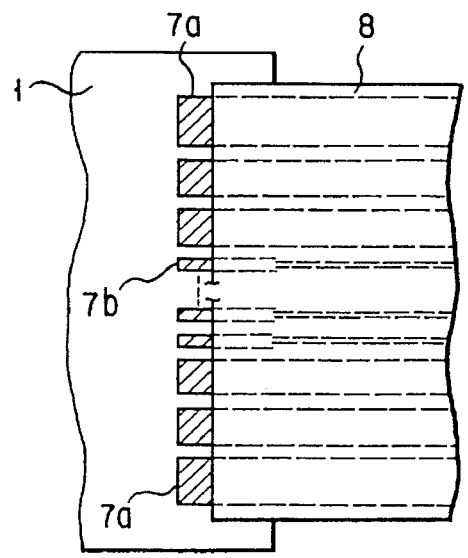
FIG. 8 is a sectional view showing an example wherein the width of a pattern at an end portion of the flexible wiring substrate is larger than that of a pattern at the central portion of the flexible wiring substray.

FIG. 8 shows an embodiment wherein the width of a pattern 7a at an end portion of a flexible wiring substrate 8 is larger than that of a pattern 7b at the central portion of the flexible wiring substrate 8. In this case, since the width of a pattern is large, the allowance of a mounting positional error is large. For this reason, even if the manufacturing precision of the flexible wiring substrate 8 or a ceramic substrate 1 varies, and an absolute positional error occurs at an end portion of the substrate, a disadvantage such as connection of an erroneous signal can be prevented. The two patterns 7a each having a large width are respectively arranged on the two end portions of the flexible wiring substrate 8, one pattern is used as a power supply line, and the other pattern is used as a ground line. In this case, a current capacity which can be supplied to an MCM can be increased by the flexible wiring substrate. Two wide patterns may be arranged on each of the two end portions of the flexible wiring substrate 8, a pair of a power supply line and a ground line may be arranged on each of both the end portions. In addition, when the flexible wiring substrate 8 is multilayered, a power supply line and a ground line are arranged on the upper and lower surfaces of the flexible wiring substrate 8, and a capacitor is formed between these conductors. In this case, the earth capacitance of the power supply can be effectively increased.

Figure 9:
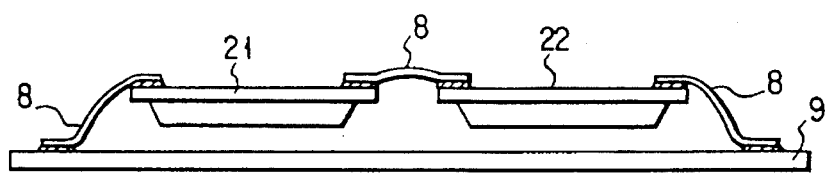
FIG. 9 is a sectional view showing an example wherein two ceramic multilayered wiring substrates are directly connected to each other by a flexible wiring substrate.

FIG. 9 shows another embodiment of the present invention. When a ceramic multilayered wiring substrate 21 comprising an aluminum nitride sintered body and a ceramic multilayered wiring substrate 22 comprising another aluminum nitride sintered body are arranged to be close to each other, the substrates are independently connected to an external substrate 9 by flexible wiring substrates 8, and these substrates are connected through the external substrate 9. However, as shown in FIG. 9, the two ceramic multilayered wiring substrates 21 and 22 may be directly connected to each other by the flexible wiring substrate 8 to decrease the number of connection portions of the external substrate 9, so that the packing density on the external substrate 9 can be increased. Alternatively, a ceramic multilayered wiring substrate 22 may be arranged above a ceramic multilayered wiring substrate 21, as shown in FIGS. 18 to 21. Further, a ceramic multilayered wiring substrate 23 may be arranged above the structure shown in FIG. 9.

Figure 10A:
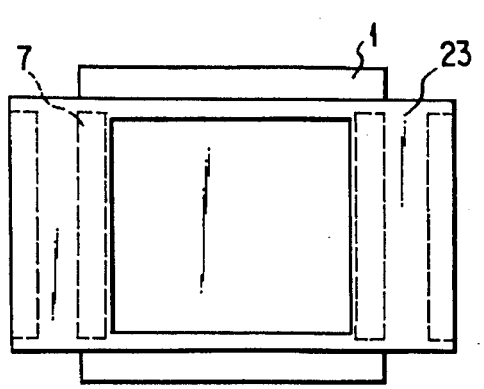
FIGS. 10A and 10B are plan views showing an example wherein a plurality of flexible wiring substrates are integrated with each other to form one flexible wiring substrate.
Figure 10B:
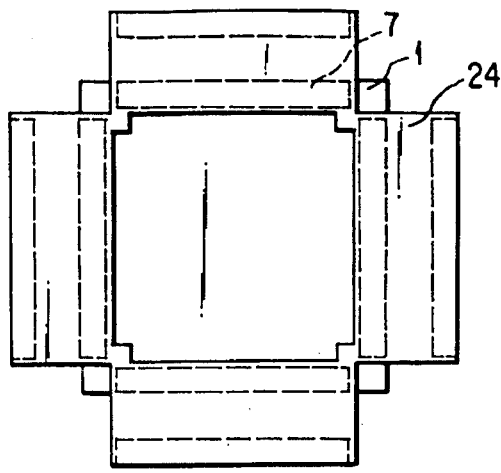

FIGS. 10A and 10B show an embodiment using an integrated flexible wiring substrate. That is, according to this embodiment, a plurality of flexible wiring substrates which are independently mounted on a ceramic multilayered wiring substrate 1 comprising an aluminum nitride sintered body in the above embodiments are integrated with each other to form single flexible wiring substrates 23 and 24. FIG. 10A shows a case wherein two flexible wiring substrates connected to both the ends of the ceramic multilayered wiring substrate 1 are integrated with each other to form the single flexible wiring substrate 23, and FIG. 10B shows a case wherein four flexible wiring substrates connected to four sides of the ceramic multilayered wiring substrate 1 are integrated with each other to form the single flexible wiring substrate 24. According to this embodiment, a mounting time can be shortened.

FIGS. 11 to 17 show various flexible wiring substrates.

Figure 11:
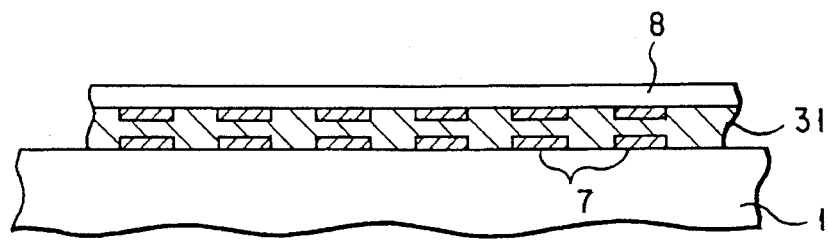
FIG. 11 is a sectional view showing an example wherein a flexible wiring substrate is mounted on a ceramic multilayered wiring substrate through an anisotropic conductive film.
Figure 12:
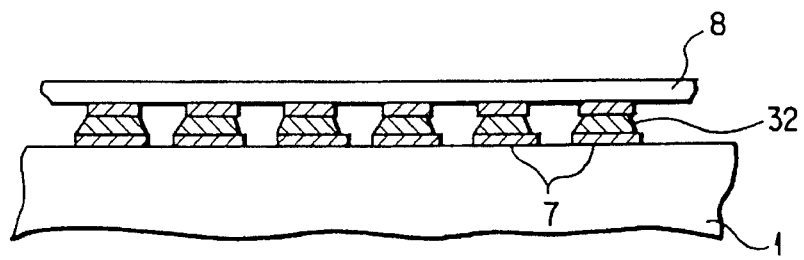
FIG. 12 is a sectional view showing an example wherein a flexible wiring substrate is mounted on a ceramic multilayered wiring substrate through a solder.

FIG. 11 shows an example wherein a flexible wiring substrate 8 is mounted on a mounting pattern 7 of a ceramic multilayered wiring substrate 1 through an anisotropic conductive film 31 (e.g., ANISORM, manufactured 6, HITACHI Chemical Industry Co.). On the other hand, FIG. 12 shows an example wherein a flexible wiring substrate 8 is mounted on a flexible wiring substrate mounting pattern 7 of a ceramic multilayered wiring substrate 1 through a solder 32.

Figure 13:
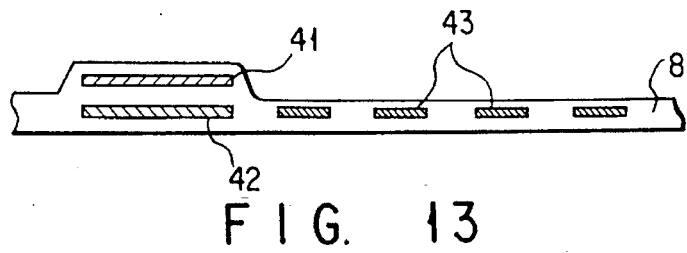
FIG. 13 is a sectional view showing an example wherein a part of a flexible wiring substrate is multilayered, and a power supply line and a ground line are respectively arranged on the upper and lower surfaces of the flexible wiring, substrate to form a capacitor.
Figure 14:
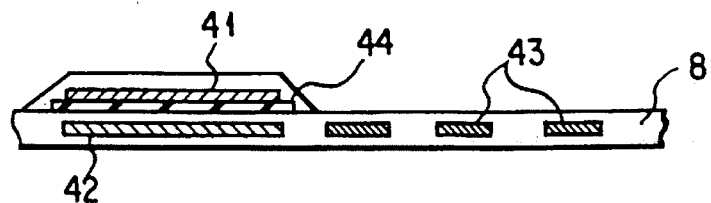
FIGS. 14 and 15 are sectional views showing an example wherein a portion interposed by the power supply line and the ground line consists of a material having a dielectric constant larger than that of other portions.
Figure 15:
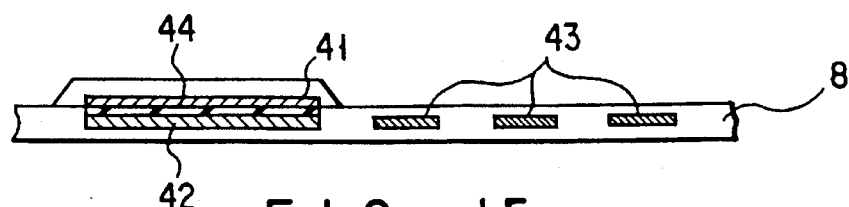

FIG. 13 shows an example wherein a part of a flexible wiring substrate 8 is multilayered, a power supply line 41 and a ground line 42 are arranged on the upper and lower surfaces of the flexible wiring substrate 8, respectively. In this case, a capacitor is formed by the power supply line 41 and the ground line 42 which sandwich a dielectric material, and an earth capacitance of a power supply can be increased. In FIG. 13 reference numerals 43 denotes signal lines. In this case, as shown in FIGS. 14 and 15, when a portion 44 interposed between the power supply line 41 and the ground line 42 consists of a material having a dielectric constant larger than that of other portions of the flexible wiring substrate, the earth capacitance of the power supply can be further increased. FIG. 14 shows a case wherein a high-dielectric layer 44 is formed on the upper surface of a flexible wiring substrate 8, and FIG. 15 shows a case wherein a high-dielectric layer 44 is buried in the flexible wiring substrate 8.

Figure 16:
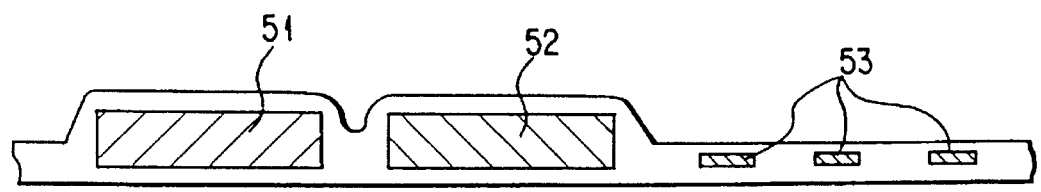
FIG. 16 is a sectional view showing an example wherein the thicknesses of the power supply line and the ground line are set to be larger than those of other signal lines.

FIG. 16 shows an example wherein each of the thicknesses of a power supply line 51 and a ground line 52 is set to be smaller than that of each of signal wiring lines 53. In this case, since a current capacity can be increased, this structure is preferably applied to a case wherein a semiconductor element having high power consumption is mounted.

Figure 17:
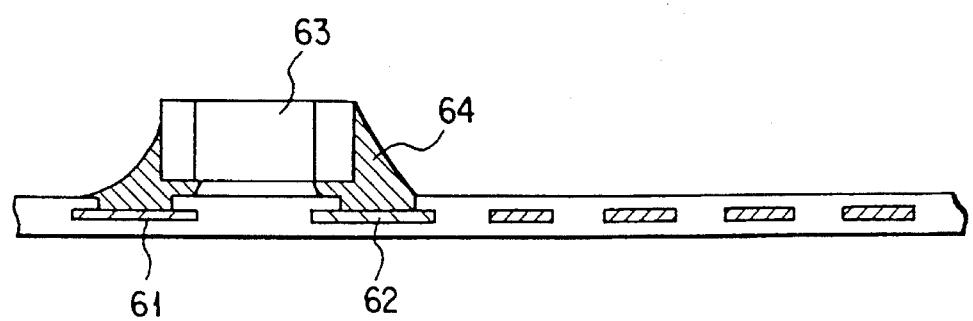
FIG. 17 is a sectional view showing an example wherein a land is formed at a portion where the power supply line and the ground line are arranged, and a chip part such as a capacitor is mounted on the land.
Figure 18:
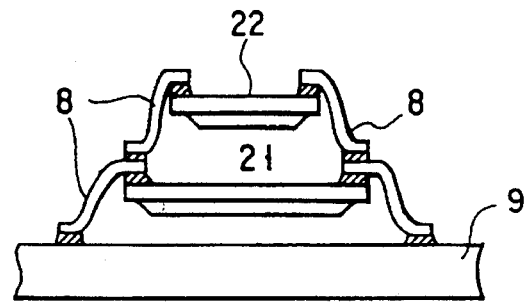
FIGS. 18 to 21 are sectional views showing examples wherein a plurality of ceramic multilayered wiring substrates are arranged in a overlapped fashion.
Figure 19:
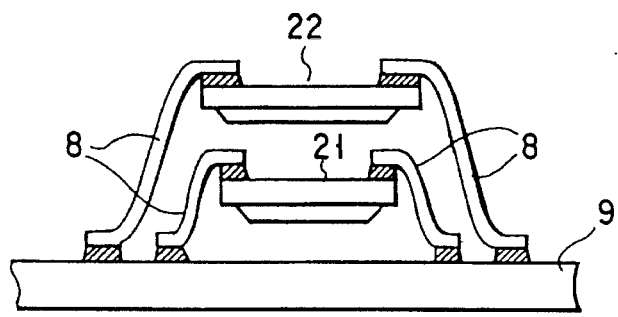
Figure 20:
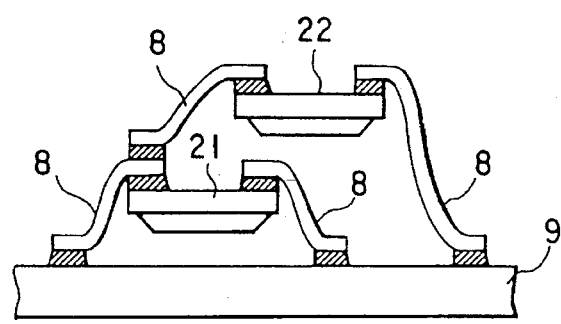
Figure 21:
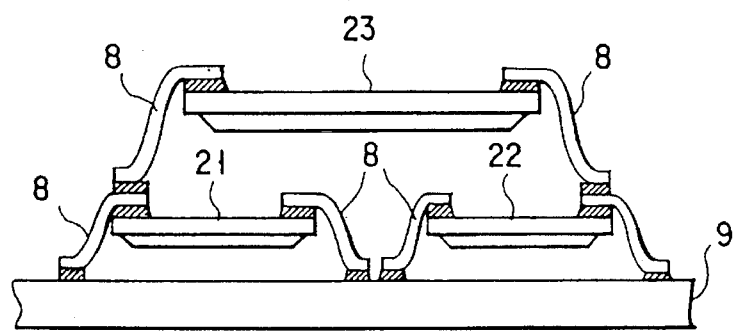

FIG. 17 shows a case wherein a land is formed at a portion where a power supply line 61 and a ground line 62 are parallelly formed, a chip part 63 such as a capacitor is mounted on the land, and the chip part 63 is connected to the power supply line 61 and the ground line 62. In this manner, a power supply can be stabilized.

As described above, according to the wiring substrates of the present invention, when a ceramic multilayered wiring substrate on which a semiconductor element and a circuit are mounted is connected to an external circuit by a flexible wiring substrate, the ceramic multilayered wiring substrate can be connected to the flexible wiring substrate by a low-temperature process, and an MCM suitable for a high-speed signal can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A wiring substrate comprising:

a ceramic substrate having upper and lower surfaces, a first conductive connection pattern on the lower surface and a second conductive connection pattern on one of said upper and lower surfaces;

a multilayered wiring portion having opposite first and second sides, said multilayered wiring portion being formed through said first conductive connection pattern and said first side being arranged on the lower surface of said ceramic substrate, said multilayered wiring portion including an insulating layer made of an organic polymer;

at least one of an integrated circuit and a circuit part mounted on said second side of said multilayered wiring portion;

a flexible wiring substrate, connected to said second conductive connection pattern, for connecting said at least one of an integrated circuit and a circuit part to an external circuit, said flexible wiring substrate including a multilayered region having a power supply layer on one side of an insulating layer and a ground layer on another side of said insulating layer, and a single-layered region having a signal wiring layer surrounded by an insulator.

2. A substrate according to claim 1, wherein said insulating layer between said power supply layer and said ground layer has a dielectric constant larger than that of the insulator surrounding said signal wiring layer.

3. A wiring substrate comprising:

a ceramic substrate having upper and lower surfaces, a first conductive connection pattern on the lower surface, a second conductive connection pattern on the upper surface, and a conductive layer connected to said first conductive connection pattern and said second conductive connection pattern in said ceramic substrate;

a multilayered wiring portion having opposite first and second sides, said multilayered wiring portion being formed through said first conductive connection pattern and said first side being arranged on the lower surface of said ceramic substrate, said multilayered wiring portion including an insulating layer made of an organic polymer;

at least one of an integrated circuit and a circuit part mounted on said second side of said multilayered wiring portion; and a flexible wiring substrate connected to said second conductive connection pattern, said flexible wiring substrate being formed with a power supply layer, a ground layer, and a signal wiring layer in a resin substrate.

4. A substrate according to claim 3, wherein said power supply layer and said ground layer are stacked with at least a resin layer disposed therebetween and a capacitor is formed by said power supply layer, said ground layer, and said resin layer.

5. A substrate according to claim 3, wherein said power supply layer, said ground layer, and said signal wiring layer are arranged in parallel, at least one of a width and a thickness of each of said power supply layer and said ground layer being larger than a corresponding at least one of a width and a thickness of said signal wiring layer.

6. A substrate according to claim 3, wherein said ceramic substrate comprises aluminum nitride or an aluminum nitride sintered body.

* * * * *